United States Patent
Kelley et al.

(10) Patent No.: US 7,688,075 B2
(45) Date of Patent: Mar. 30, 2010

(54) LITHIUM SULFUR RECHARGEABLE BATTERY FUEL GAUGE SYSTEMS AND METHODS

(75) Inventors: Tracy E Kelley, Tucson, AZ (US); Chariclea Scordilis-Kelley, Tucson, AZ (US); Vincent J Puglisi, Tucson, AZ (US)

(73) Assignee: Sion Power Corporation, Tucson, AZ (US)

( * ) Notice: Subject to any disclaimer, the term of this patent is extended or adjusted under 35 U.S.C. 154(b) by 1319 days.

(21) Appl. No.: 11/111,262

(22) Filed: Apr. 20, 2005

(65) Prior Publication Data
US 2006/0238203 A1 Oct. 26, 2006

(51) Int. Cl.
*G01N 27/413* (2006.01)
*H02J 7/00* (2006.01)
(52) U.S. Cl. .................. 324/426; 320/132; 320/133; 320/134; 324/433
(58) Field of Classification Search ............ 324/426, 324/433; 320/132, 134, 133
See application file for complete search history.

(56) References Cited

U.S. PATENT DOCUMENTS

| | | | |
|---|---|---|---|
| 6,114,838 A * | 9/2000 | Brink et al. | 320/136 |
| 6,774,636 B2 | 8/2004 | Guiheen et al. | |
| 6,789,026 B2 | 9/2004 | Barsoukov et al. | |
| 2003/0052689 A1 | 3/2003 | Jang et al. | |
| 2003/0137303 A1 | 7/2003 | Roepke | |
| 2003/0206021 A1* | 11/2003 | Laletin et al. | 324/426 |
| 2004/0222768 A1 | 11/2004 | Moore et al. | |

FOREIGN PATENT DOCUMENTS

JP        2000 121710 A        4/2000

OTHER PUBLICATIONS

"Determination of State-of-Charge and State-of-Health of Batteries by Fuzzy Logic Methodolgy," Alvin J. Salkind et al., Journal of Power Sources, Elsevier, Amsterdam, NL, vol. 80, No. 1-2, Jul. 1999, pp. 293-300.
"Electrochemical Properties of Lithium-Sulfur Batteries," Bo Jin et al., Journal of Power Sources, Elsevier, Amsterdam, NL, vol. 117, No. 1-2, May 2003, pp. 148-152.

* cited by examiner

*Primary Examiner*—Edward Tso
*Assistant Examiner*—Yalkew Fantu
(74) *Attorney, Agent, or Firm*—Wolf, Greenfield & Sacks, P.C.

(57) ABSTRACT

Systems and methods for accurately determining the state of charge and the relative age of lithium sulfur batteries are provided. The cell resistance and taper input charge of a particular type of lithium sulfur battery are respectively measured to determine the state of charge and age of the battery.

26 Claims, 4 Drawing Sheets

LITHIUM SULFUR RECHARGEABLE BATTERY FUEL GAUGE SYSTEMS AND METHODS

BACKGROUND OF THE INVENTION

The present invention relates generally to the charging of lithium sulfur batteries, and more particularly to systems and methods for accurately determining the state of charge and the relative age of lithium sulfur batteries.

The ability to discern how much energy is stored in a rechargeable battery of a portable consumer electronic device, such as a cellular telephone or laptop computer, is a feature that is highly valued by the user of the device. Therefore, common device systems, such as those using lithium-ion, nickel metal hydride, or nickel-cadmium rechargeable batteries, incorporate some technique to gauge the amount of energy or charge presently stored in the battery cell. One common approach is to determine the state of charge of the battery based upon the measured open-circuit voltage for that battery using look-up tables. See, for example, U.S. Pat. No. 6,789,026 to Barsoukov et al. and U.S. Pat. No. 6,774,636 to Guiheen et al., each of which is hereby incorporated by reference herein in its entirety.

The state of charge ("SOC") of a battery is the presently stored charge expressed as a fraction of the maximum charge that can be stored in the battery. The SOC of a battery is very useful information in that its user may know how charged the battery is relative to the maximum charge or capacity of the battery during its current charge/discharge cycle. However, the maximum capacity of a battery degrades with the "age" of the battery (i.e., the number of charge/discharge cycles to which the battery has been subjected, and not the actual amount of time that the battery has existed). The above-described conventional open-circuit voltage-based algorithms do not use stored look-up tables that adequately represent the characteristics of the battery as it ages to determine its state of charge.

Lithium sulfur batteries have gained favor in recent years due to their light weight and high energy density. The use of lithium anodes (e.g., lithium foil or vacuum deposited lithium of either pure lithium or lithium alloyed with tin or aluminum, with or without an integral current collector or various lithium intercalation compounds, such as graphites, cokes, and tin oxide, etc.) provides an opportunity to construct lithium sulfur battery cells that are lighter in weight and have a higher energy density than cells such as lithium-ion, nickel metal hydride, or nickel-cadmium cells. These features are highly desirable for batteries in portable electronic devices.

Lithium sulfur battery designs are particularly suitable for portable electronic devices because of their light weight and their high surface area, which allows high rate capability as well as reduced current density on charging. Several types of cathode materials for the manufacture of lithium batteries are known, including cathode materials having sulfur-sulfur bonds, wherein high energy capacity and rechargeability are achieved from the electrochemical cleavage (via reduction) and reformation (via oxidation) of the sulfur-sulfur bonds. Sulfur containing cathode materials, having sulfur-sulfur bonds, for use in electrochemical cells having a lithium anode, such as described above, may include elemental sulfur, organo-sulfur compounds, various polysulfides, or carbon-sulfur compositions.

Accordingly, it would be desirable to provide systems and methods for accurately determining the state of charge of lithium sulfur battery cells, and for accurately determining the age of battery cells.

SUMMARY OF THE INVENTION

It is an object of this invention to provide systems and methods for accurately determining the state of charge of lithium sulfur battery cells.

It is also an object of this invention to provide such systems and methods for accurately determining the age of battery cells.

In accordance with one embodiment of the present invention, there is provided a method for creating a look-up table of cell resistance versus state of charge for a lithium sulfur battery of a particular type with a known capacity. The method includes charging the battery until a voltage across the battery increases to a predetermined maximum voltage; continuing to charge the battery at the predetermined maximum voltage until an input current to the battery decreases to a predetermined minimum current; measuring a cell resistance for the battery, wherein this cell resistance is defined as the cell resistance at 100% state of charge for the particular type of lithium sulfur battery; and recording the cell resistance at 100% state of charge. Next, the method teaches discharging the battery by a predetermined percentage of its capacity so that a present battery state of charge is less than a previous battery state of charge; measuring a cell resistance for the battery, wherein the cell resistance is defined as the cell resistance at the present state of charge for the particular type of lithium sulfur battery; recording the cell resistance at the present state of charge; and repeating these discharging, measuring, and recording steps until the present state of charge of the battery equals a predetermined lower cutoff voltage. Finally, the method teaches creating the look-up table of cell resistance versus state of charge for state of charge values from 0% to 100%.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE PREFERRED EMBODIMENTS

The present invention provides systems and methods for accurately determining the state of charge of lithium sulfur battery cells. In accordance with one aspect of this invention, look-up tables or algorithms for each type of lithium sulfur battery are prepared and stored in a computer chip or database. In various embodiments of the present invention, this chip or database may preferably be embedded in the lithium sulfur battery/charger system itself or within the load-drawing device. These look-up tables correlate cell resistance ("CR") at various ambient temperatures and ages of the battery, for example, versus state of charge ("SOC") for various types of lithium sulfur battery.

Unlike other common battery systems, a lithium sulfur battery includes a cathode whose active chemical material experiences a progression of redox reactions during discharge. These reactions involve polysulfide reduction from higher polysulfides (e.g., $Li_2S_8$), to the intermediate polysulfides, and then on to the lower polysulfides (e.g., $Li_2S$). This electrochemical characteristic of lithium sulfur battery cells causes a gradual resistance change in the electrolyte during discharge that does not occur in other common battery systems. This change in cell resistance ("CR") may be utilized to determine accurately the state of charge of a lithium sulfur battery, as described herein below.

Figure 1:
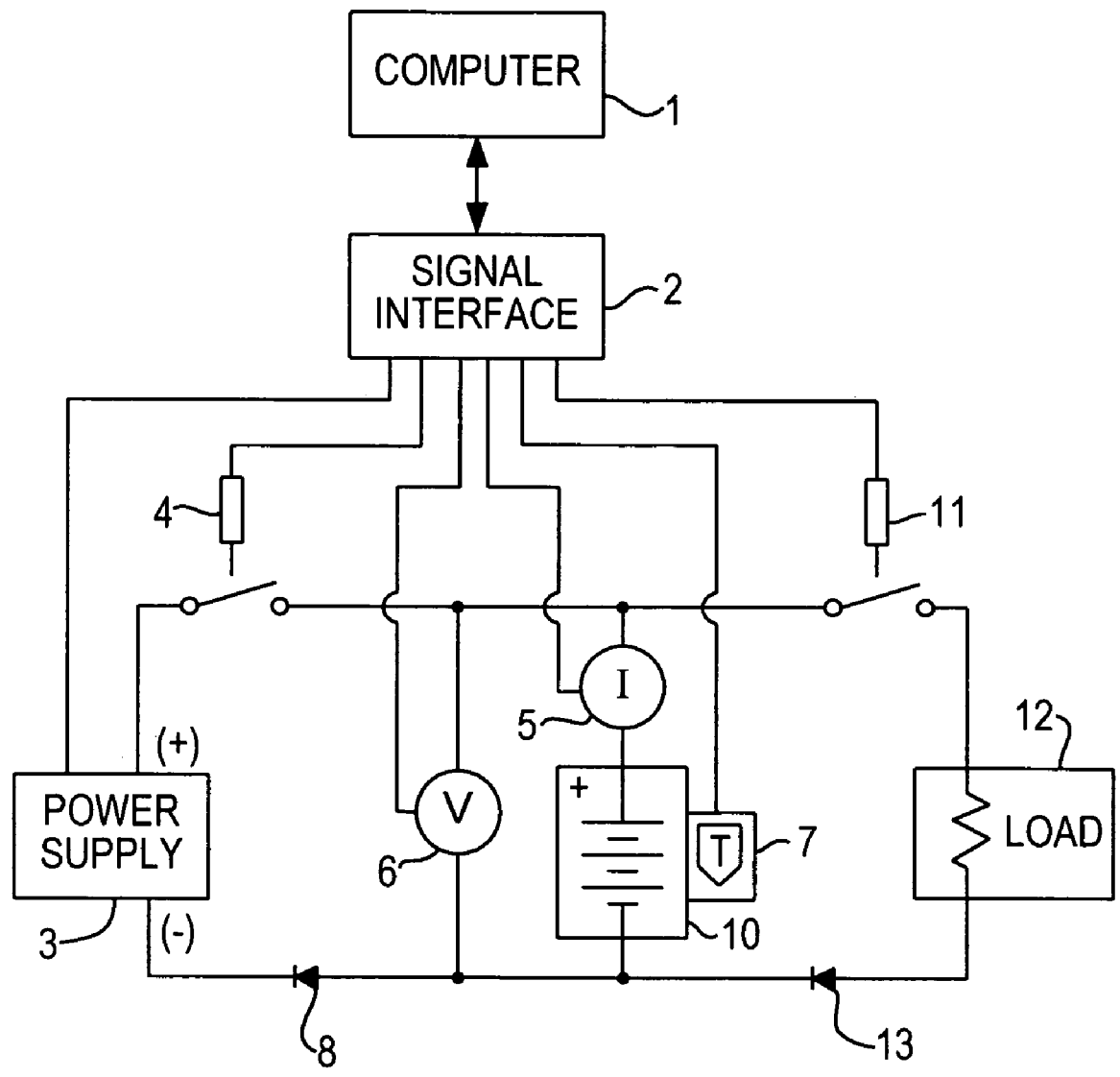
FIG. 1 is a simplified schematic block diagram of an illustrative battery measurement system in accordance with the present invention.

Referring to FIG. 1, a lithium-sulfur battery 10, of a known type, is shown with a measurement system 100 including voltmeter 6, ammeter 5, and thermocouple 7. Power supply 3 can be used to charge battery 10 when battery-charging relay 4 is activated. Blocking diode 8 is used to limit the direction of current flow so that current flows only from the power supply 3 to the battery 10 during charging. Battery 10 can be discharged through device or load 12 and blocking diode 13 when battery-discharging relay 11 is activated. The circuit of FIG. 1 can be used both to create the look-up tables of the invention for a battery and to determine the state of charge and age of a battery using those tables.

A computer 1 receives voltage measurements from voltmeter 6 via a signal interface 2. Computer 1 also receives battery temperature measurements from thermocouple 7 and electrical current measurements from ammeter 5 via the signal interface 2. Computer 1 also controls the on-off states of the battery charging relay 4 and the battery-discharging relay 11 via the signal interface 2. Computer 1 may preferably be an application-specific integrated chip (ASIC chip), which may be a stand alone chip incorporated into battery 10 or may be incorporated into load 12 (e.g., a laptop computer that requires power from battery 10). Signal interface 2 may preferably be a systems management bus (SM bus), which is a control interface, power supply 3 may preferably be the charger system, whereas ammeter 5 and voltmeter 6 are preferably not stand alone devices but rather are preferably electronic circuits.

Measurement system 100 shown in FIG. 1 can be used to create a look-up table of cell resistance ("CR") versus state of charge ("SOC") for a particular type of lithium sulfur battery as follows. First, battery-charging relay 4 is activated and battery-discharging relay 11 is deactivated. Next, battery 10 is charged at an initial constant current ("$I_o$"), for example 500 milliAmperes, by increasing the output current of power supply 3 while monitoring charging voltage into battery 10 using voltmeter 6. Battery 10 is charged at this constant current until the voltage across the battery, as measured by voltmeter 6 reaches a maximum permitted voltage ("$V_{Max}$"). A battery manufacturer determines $V_{Max}$ based on safety considerations, for example. A typical value of $V_{Max}$ for lithium sulfur batteries is 2.5 Volts per cell. For a battery 10 consisting of multiple cells connected in series: $V_{Max\ (Battery)} = V_{Max\ (Cell)}$ *N, where N is the number of cells connected in series.

When $V_{Max}$ is reached, charging is continued and clamped at this constant voltage, $V_{Max}$, and the charging current is thereby reduced. This step is commonly referred to as taper charging. When the input current has decreased to a certain point, for example to 20% or less of the initial constant current ("$I_o$"), the cells being charged may be considered to be fully charged and at 100% SOC. Therefore, the battery may be considered to be fully charged and at 100% SOC when the input current has decreased to $1/50^{th}$ or less of the C-rate of the cell or battery (i.e., $1/50^{th}$ or less of the charging current required to charge the cell in one hour). It is to be understood, that battery 10 may be charged with a varying current as opposed to $I_o$ without departing from the spirit and scope of the present invention.

Battery-charging relay 4 is then deactivated and battery 10 is preferably allowed to stabilize, where battery stabilization is determined by the variation in the open-circuit voltage ("OCV") of battery 10 as measured by voltmeter 6. Battery 10 may be considered to be stabilized when the rate of change of the OCV is less than a threshold, for example 0.001 to 0.01 Volts/minute. Stabilization time for a lithium sulfur battery can be about 2-30 minutes. It should be noted that stabilization may not be necessary or required in each step of the present invention. A double pulse may preferably be applied, and the change in battery resistance may be measured as the measured change in voltage divided by the measured change in current between the pulses (e.g., if charging at the C-rate, by applying a first pulse that is double the C-rate and by then applying a second pulse that is half or quadruple the C-rate).

The cell resistance of battery 10 at 100% SOC ($CR_{SOC=100\%}$) may then be measured by applying a double pulse on the battery and calculating the change in voltage divided by the change in current. This may be done by first activating battery-charging relay 4 and deactivating battery-discharging relay 11. Next, a first pulse followed by a second pulse may be imposed on battery 10 by increasing the output voltage of power supply 3 while monitoring the change in current using ammeter 5 and while monitoring the change in voltage using voltmeter 6. The cell resistance of battery 10 at 100% SOC($CR_{SOC}$=100%) is then recorded as the monitored change in voltage divided by the monitored change in current. Alternatively, a benchmark constant charging or discharging current may be applied to the battery and a single pulse may be imposed to allow for the polarization measurement of the cell resistance of the battery to be taken as the monitored change in voltage divided by the monitored change in current with respect to the benchmark information. In a preferred embodiment, the applied pulse may be on the order of 0.1-1.0 seconds and at an applied current of 2-4 Amperes for a lithium sulfur battery with a capacity of 2.5 Ampere-hours ("Ah"). The duration of this pulse is generally dependant on the current at which the battery is being discharged, such that this diagnostic does not drain the battery unnecessarily. The pulse is preferably on the order of 2 to 10 times higher or lower than the rate at which the cell is charging or discharging in order to provide the required diagnostic, as mentioned above.

Second, battery 10 may be discharged at a predetermined discharge rate to a lower cutoff voltage ("$V_{min}$") through load 12 by activating battery-discharging relay 11 and deactivating battery-charging relay 4. The predetermined discharge rate can be selected as the value to discharge the battery completely, from 100% SOC to 0% SOC, in a time ranging from between 2-10 hours, for example. A battery manufacturer may, for example, determine $V_{Min}$ based on safety considerations. A typical value of $V_{Min}$ for lithium sulfur batteries under normal conditions (i.e., under normal temperatures and at normal discharge rates) is 1.7 Volts per cell. Typical discharge durations to exhaust a lithium sulfur battery are from 1 to 5 hours (i.e., from the C-rate to $1/5^{th}$ times the C-rate). However, there are applications, such as aerospace applications, wherein the battery may be typically required to discharge its energy periodically while in the dark for times of from 10 to 12 hours. In contrast, there are other applications, such as laptop computers and tablet personal computers, which, at the very least, require the battery to deliver high current pulses. Therefore, battery 10 may be discharged at a variable discharge rate without departing from the spirit and scope of the present invention. For a battery 10 consisting of multiple cells connected in series: $V_{Min\ (Battery)} = V_{Min\ (Cell)} * N$, where N is the number of cells connected in series.

When $V_{Min}$ is reached, the cells may be considered fully discharged and at 0% SOC. Battery-discharging relay 11 is then deactivated and battery 10 may preferably be allowed to stabilize.

The cell resistance of battery 10 at 0% SOC ($CR_{SOC=0\%}$) is then recorded by applying a pulse on the battery and calculating the change in voltage divided by the change in current, as described above with respect to 100% SOC. The capacity of battery 10 can be calculated by integrating the discharge rates (Amperes) by the discharge time (hours). Note that battery capacity is typically specified in Ampere-hours (Ah), where 1 Ah equals 3600 Coulombs.

Third, a predetermined number of Coulombs, for example 10% of the battery capacity, may be charged (input) into battery 10 from power supply 3 at a predetermined or variable charge rate by activating battery-charging relay 4 and deactivating battery-discharging relay 11. Battery-charging relay 4 is then deactivated and battery 10 may preferably be allowed to stabilize.

The cell resistance of battery 10 at 10% SOC ($CR_{SOC=10\%}$) is then recorded by applying a pulse on the battery and calculating the change in voltage divided by the change in current, as described above. This procedure is repeated and a set of battery 10 cell resistances at various states of charge (e.g., 20%, 30%, 40%, 50%, 60%, 70%, 80%, 90%) are recorded. In another embodiment of the present invention, the cell resistance ("CR") is measured and recorded at various states of charge, as described above, but while the battery is discharging after being fully charged (e.g., 90%, 80%, 70%, 60%, 50%, 40%, 30%, 20%, 10% SOC).

Advantageously, additional tables of cell resistance ("CR") versus state of charge ("SOC") are prepared for various temperatures by performing the same procedure previously described (e.g., at −40° Celsius, −30° Celsius, −20° Celsius, −10° Celsius, 0° Celsius, +10° Celsius, +20° Celsius, +30° Celsius, +40° Celsius, +50° Celsius, and +60° Celsius).

It is to be generally understood that additional tables of cell resistance ("CR") versus state of charge ("SOC") at various temperatures may be created for various batteries of the same type. An average of the values of those tables may be used to create a master table for that type of battery to avoid relying too heavily on any data from one particular battery of the particular type being investigated.

Figure 2:
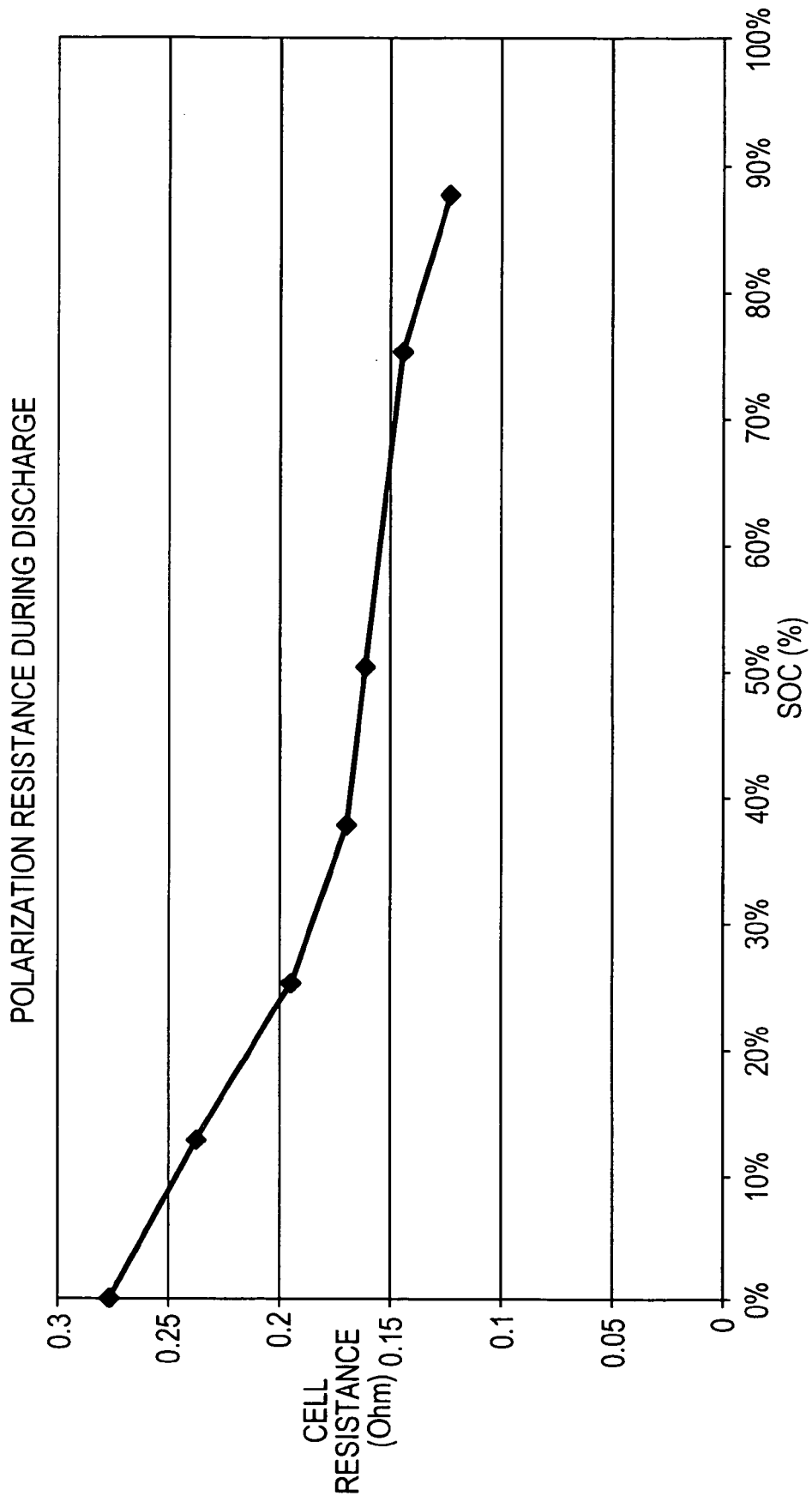
FIG. 2 shows a sample plot of cell resistance versus state of charge for a typical lithium sulfur battery.

Referring again to FIG. 1, a lithium sulfur battery 10 of a known type, but with an unknown state of charge ("SOC") may be placed in, or preferably integrally provided with, a measurement system 100 consisting of power supply 3, ammeter 5, and voltmeter 6 with battery charging relay 4 activated and battery discharging relay 11 deactivated. Power supply 3, ammeter 5 and voltmeter 6 are connected through signal interface 2 to computer 1. A technician operating system 100 may input the battery type of battery 10 into computer 1. Computer 1 may then execute a known correlation algorithm, for example a table look-up followed by linear interpolation, to correlate the measured cell resistance ("CR") with the state-of-charge ("SOC") for the type of battery 10 under test. FIG. 2 shows a sample plot of cell resistance (measured in Ohms) versus state of charge for a typical lithium sulfur battery.

In accordance with a further aspect of the present invention, a thermocouple 7 is coupled to battery 10 to provide battery temperature as an input to computer 1 via signal interface 2, as shown in FIG. 1. Therefore, the CR correlation algorithm will now use three inputs (i.e., lithium sulfur battery type, cell resistance, and battery temperature). For example, linear interpolation or a similar calculation can calculate state of charge ("SOC") for a battery 10 at a temperature intermediate to temperature values associated with stored tables. As mentioned above, interface 2, computer 1, and thermocouple 7, may preferably be provided along with battery 10 as an integral device with the appropriate look-up tables and battery-type information previously stored thereon.

Figure 3:
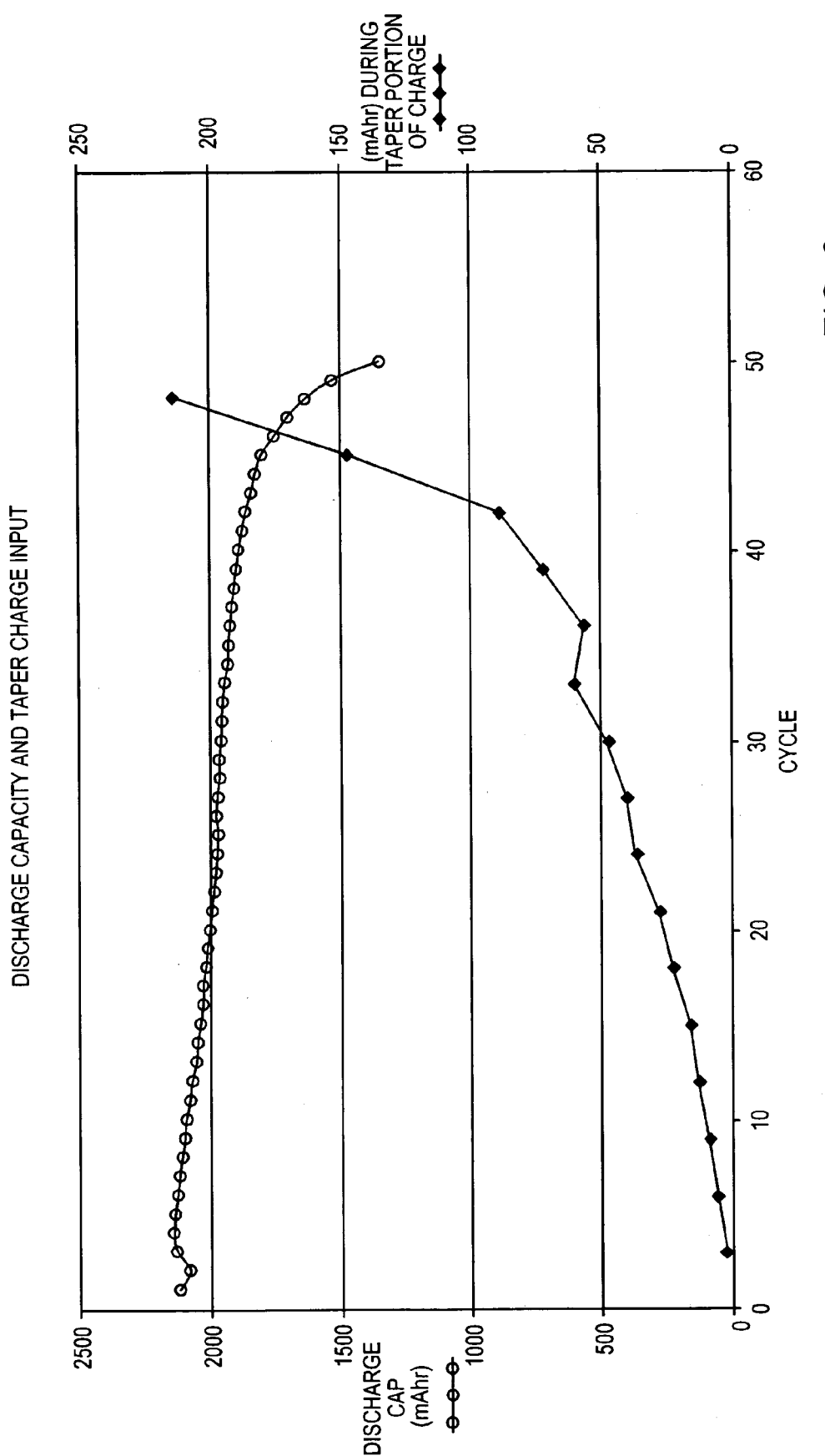
FIG. 3 shows a comparison of sample plots of discharge capacity and taper input charge capacity each versus age for a typical lithium sulfur battery.

In accordance with an other embodiment of the present invention, systems and methods are provided to determine the age of a lithium sulfur battery based upon the present capacity of the taper input charge for that battery. FIG. 3 shows a comparison of a typical lithium sulfur cell's discharge capacity and taper input charge capacity, each versus the cell's age (cycle life), clearly illustrating the pronounced relationship therebetween.

The measurement system 100 shown in FIG. 1 can also be used to create a look-up table of taper input charge ("TIC") versus age for a particular type of battery 10 with a known age (i.e., the number of charge/discharge cycles to which the battery has previously been subjected), as follows. First, as described above with respect to initially charging a battery when creating a look-up table of cell resistance versus state of charge, battery-charging relay 4 is activated and battery-discharging relay 11 is deactivated. Next, battery 10 may be charged, for example at an initial constant current ("$I_o$") (e.g., 500 milliAmperes), by increasing the output current of power supply 3 while monitoring charging voltage into battery 10 using voltmeter 6. Battery 10 is charged until the voltage across the battery, as measured by voltmeter 6 reaches a maximum permitted voltage ("$V_{Max}$").

When $V_{Max}$ is reached, charging is continued and clamped at this constant voltage, $V_{Max}$, and the charging current is thereby reduced. When the input current has decreased to a certain minimum threshold point during this taper charging step, for example to 20% or less of the initial constant current, the cells being charged may be considered to be fully charged. The taper input charge ("TIC") of battery 10 is preferably calculated by integrating the taper charging rate (Amperes) by the duration of time (hours) it takes between reaching $V_{Max}$ and decreasing the input current to its minimum threshold (e.g., 10% of the initial constant current). That is to say, the taper input charge is calculated to be the total charge input into the battery during the taper charging step.

Once the taper input charge of battery 10 is calculated, the TIC of battery 10 of a known age "X" ($TIC_{AGE=X}$) is then recorded. This procedure is repeated and a taper input charge at various ages in the life of battery 10 (e.g., after having subjected battery 10 to 1, 10, 20, 30, 40, 50, 60, 70, 80, 90, 100, 200, 300, 400, 500, 600, 700, 800, 900, and 1000 charge/discharge cycles) are recorded. It is not necessary to charge fully a completely drained battery in order to measure its TIC. A battery that has been previously charged to any percentage of its full capacity may then be fully charged and have its TIC measured.

Advantageously, additional tables of taper input charge ("TIC") versus age are prepared for various temperatures by performing the fully-charge procedure previously described (e.g., at −40° Celsius, −30° Celsius, −20° Celsius, −10° Celsius, 0° Celsius, +10° Celsius, +20° Celsius, +30° Celsius, +40° Celsius, +50° Celsius, and +60° Celsius). Moreover, additional tables of taper input charge ("TIC") versus age, as well as cell resistance ("CR") versus state of charge ("SOC") may preferably be prepared for various charge/discharge rates being used, for different duty cycles, and for abusive out of specification conditions (e.g., an abusive temperature scenario wherein the battery was exposed to extremely high temperatures for a prolonged period of time), for example. Furthermore, as described above with respect to cell resistance ("CR"), additional tables of taper input charge ("TIC") versus age at various temperatures may be created for various batteries of the same type. An average of the values of those tables may be used to create a master table for that type of battery to avoid relying too heavily on any data that may be an inconsistency due to one particular battery of the particular type being investigated.

Figure 4:
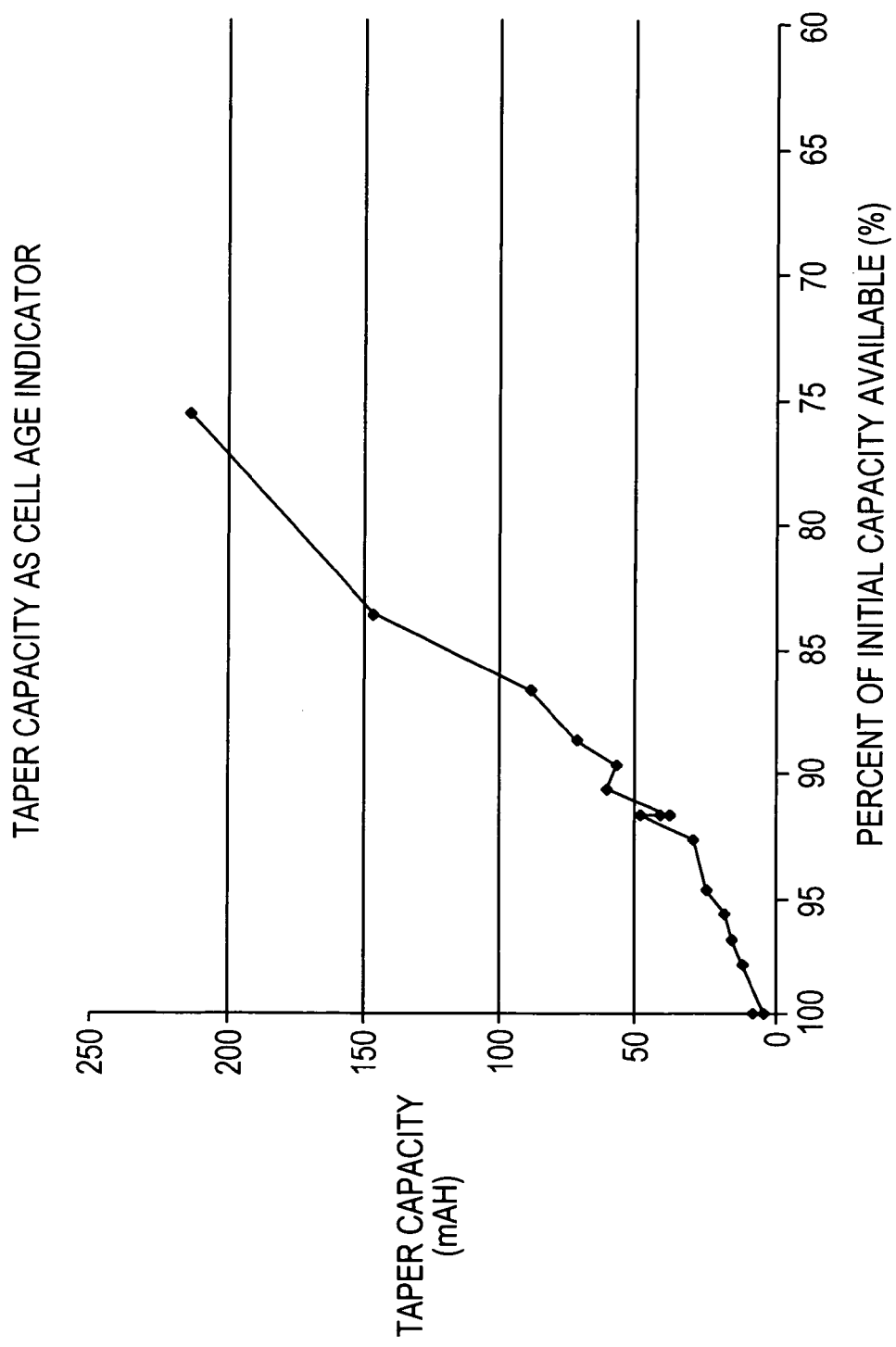
FIG. 4 shows a sample plot of taper charge input versus present capacity, measured as a percentage of its original capacity, for a typical lithium sulfur battery.

Referring again to FIG. 1, a lithium sulfur battery 10 of a known type, but with an unknown state of charge ("SOC") and with an unknown age, may be placed in, or preferably integrally provided with, a measurement system 100 consisting of power supply 3, ammeter 5, and voltmeter 6 with battery charging relay 4 activated and battery discharging relay 11 deactivated. Power supply 3, ammeter 5 and voltmeter 6 are connected through signal interface 2 to computer 1. A technician operating computer 1 may input the battery type of battery 10 into the computer. Computer 1 will then execute a correlation algorithm, for example a table look-up followed by linear interpolation, to correlate the taper input charge ("TIC") measured by the measurement system with the age for the type of battery 10 under test. FIG. 4 shows a sample plot of taper charge input (measured in mAh) versus the cell's present capacity (measured as a percentage of the cell's capacity after having been subjected to only five charge/discharge cycles) for a typical lithium sulfur battery.

In accordance with a further aspect of the invention, thermocouple 7 is coupled to battery 10 to provide battery temperature as an input to computer 1 via signal interface 2, as shown in FIG. 1. Like with the CR correlation algorithm, the TIC correlation algorithm may now use three inputs (i.e., battery type, taper input charge, and battery temperature) to determine the age of the battery. For example, linear interpolation or a similar calculation can calculate the age of a battery 10 at a temperature intermediate to temperature values associated with stored tables. As mentioned above, interface 2, computer 1, and thermocouple 7, may preferably be provided along with battery 10 as an integral device with the appropriate look-up tables and battery-type information previously stored thereon.

As mentioned above, in a preferred embodiment of the present invention, the age of the battery may be taken into account when determining the state of charge of the battery. Therefore, additional tables of cell resistance ("CR") versus state of charge ("SOC") are preferably prepared and recorded for the battery at various known ages in the life of battery 10 (e.g., after having subjected battery 10 to 1, 10, 20, 30, 40, 50, 60, 70, 80, 90, 100, 200, 300, 400, 500, 600, 700, 800, 900, and 1000 charge/discharge cycles). Preferably, each time battery 10 is fully charged, its present TIC is recorded (e.g., by computer 1), such that the next time it is desired to determine the state of charge of the battery, this current TIC information will be available and the CR correlation algorithm described above will now preferably use at least four inputs (i.e., battery type, current TIC (i.e., age via a TIC correlation algorithm), cell resistance, and battery temperature).

Various types of circuitries and devices can be used to implement the measurement system as described above according to this invention.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A method for creating a look-up table of cell resistance versus state of charge for a lithium sulfur battery of a particular type and determining the capacity thereof, said method comprising the steps of:
    a) charging said battery until a voltage across said battery increases to a predetermined maximum voltage;
    b) continuing to charge said battery at said predetermined maximum voltage until an input current to said battery decreases to a predetermined minimum current;
    c) measuring a cell resistance for said battery, said cell resistance being defined as the cell resistance at 100% state of charge for said particular type of lithium sulfur battery;
    d) recording said cell resistance at 100% state of charge;
    e) discharging said battery at a discharge rate to a predetermined lower cutoff voltage and recording a discharge time period;
    f) integrating said discharge time period with said discharge rate and storing the result, said integration result being defined as the battery capacity for said particular type of lithium sulfur battery;
    g) measuring a cell resistance for said battery, said cell resistance being defined as the cell resistance at 0% state of charge for said particular type of lithium sulfur battery;
    h) recording said cell resistance at 0% state of charge;
    i) charging said battery with a predetermined percentage of said battery capacity so that a present battery state of charge exceeds a previous battery state of charge;
    j) measuring a cell resistance for said battery, said cell resistance being defined as the cell resistance at the present state of charge for said particular type of lithium sulfur battery;
    k) recording said cell resistance at the present state of charge;
    l) repeating said steps (i), (j), and (k) until the present state of charge of said battery equals said battery capacity for said particular type of lithium sulfur battery; and
    m) creating said look-up table of cell resistance versus state of charge for state of charge values from 0% to 100%.

2. The method of claim 1 further comprising the step of:
    n) allowing said battery to stabilize for a period of time, wherein said period of time is the time required for the rate of change of the open-circuit voltage of said battery to decrease below a predefined threshold.

3. The method of claim 2, wherein said predefined threshold for rate of change of the open-circuit voltage is within a range of 0.001 to 0.01 Volts/minute.

4. The method of claim 1, wherein said predetermined percentage of said battery capacity is 10%.

5. The method of claim 1, wherein all the steps of claim 1 are repeated at a set of predetermined temperatures.

6. The method of claim 5, wherein said set of predetermined temperatures consists of −40° Celsius, −30° Celsius, −20° Celsius, −10° Celsius, 0° Celsius, +10° Celsius, +20° Celsius, +30.degree. Celsius, +40° Celsius, +50° Celsius, and +60° Celsius.

7. The method of claim 1, wherein all the steps of claim 1 are repeated at a set of predetermined ages in the life of said battery.

8. The method of claim 7, wherein said set of predetermined ages consists of said battery after having been subjected to 1, 10, 20, 30, 40, 50, 60, 70, 80, 90, 100, 200, 300, 400, 500, 600, 700, 800, 900, and 1000 charge/discharge cycles.

9. The method of claim 1, wherein said discharge rate is variable.

10. A method for creating a look-up table of cell resistance versus state of charge for a lithium sulfur battery of a particular type with a known capacity, said method comprising the steps of:
   a) charging said battery until a voltage across said battery increases to a predetermined maximum voltage;
   b) continuing to charge said battery at said predetermined maximum voltage until an input current to said battery decreases to a predetermined minimum current;
   c) measuring a cell resistance for said battery, said cell resistance being defined as the cell resistance at 100% state of charge for said particular type of lithium sulfur battery;
   d) recording said cell resistance at 100% state of charge;
   e) discharging said battery by a predetermined percentage of the capacity of said battery so that a present battery state of charge is less than a previous battery state of charge;
   f) measuring a cell resistance for said battery, said cell resistance being defined as the cell resistance at the present state of charge for said particular type of lithium sulfur battery;
   g) recording said cell resistance at the present state of charge;
   h) repeating said steps (e), (f), and (g) until the present state of charge of said battery equals a predetermined lower cutoff voltage; and
   i) creating said look-up table of cell resistance versus state of charge for state of charge values from 100% to 0%.

11. A method for determining the state of charge of a lithium sulfur battery of a particular type using a look-up table of cell resistance versus state of charge for said particular type of lithium sulfur battery, said method comprising the steps of:
   a) inputting a battery type into a computer;
   b) measuring a cell resistance for said battery, said cell resistance being input into said computer;
   c) executing a cell resistance correlation algorithm based on inputs comprising:
      i) the type of said battery inputted into said computer; and
      ii) the measured cell resistance for said battery; and
   d) determining the state of charge of said lithium sulfur battery based on said cell resistance correlation algorithm.

12. The method of claim 11, wherein said cell resistance correlation algorithm comprises a table look-up followed by linear interpolation.

13. The method of claim 11, wherein said inputs to said cell resistance correlation algorithm further comprise measured battery temperature.

14. The method of claim 11 further comprising the step of:
   e) inputting an age of said battery into said computer.

15. The method of claim 14, wherein said inputs to said cell resistance correlation algorithm further comprise the age of said battery inputted into said computer.

16. A method for creating a look-up table of taper input charge versus age for a lithium sulfur battery of a particular type, said method comprising the steps of:
   a) subjecting said battery to a first known number of fully charging and discharging cycles;
   b) charging said battery until a voltage across said battery increases to a predetermined maximum voltage;
   c) taper charging said battery at said predetermined maximum voltage until an input current to said battery decreases to a predetermined minimum current and recording a taper charge time period;
   d) integrating said taper charge time period by said input current during said taper charge time period and storing the product, said integration product being defined as the taper input charge for said particular type of lithium sulfur battery at the age of said particular number;
   e) recording said taper input charge at said age of said particular number;
   f) repeating said steps (a), (b), (c), (d), and (e) for additional known numbers of fully charging and discharging cycles for said battery, said recording step (e) recording said taper input charges for the additional known numbers of fully charging and discharging cycles for said battery; and
   g) creating said look-up table of taper input charge versus age for said particular type of lithium sulfur battery using said first known and said additional known numbers of fully charging and discharging cycles for said battery.

17. The method of claim 16, wherein said first known and said additional known numbers of fully charging and discharging cycles for said battery are 1, 10, 20, 30, 40, 50, 60, 70, 80, 90, 100, 200, 300, 400, 500, 600, 700, 800, 900, and 1000.

18. The method of claim 16, wherein all the steps of claim 16 are repeated at a set of predetermined temperatures.

19. The method of claim 18, wherein said set of predetermined temperatures consists of −40° Celsius, −30° Celsius, −20° Celsius, −10° Celsius, 0° Celsius, +10° Celsius, +20° Celsius, +30° Celsius, +40° Celsius, +50° Celsius, and +60° Celsius.

20. A method for determining the age of a lithium sulfur battery of a particular type using a look-up table of taper input charge versus age for said particular type of lithium sulfur battery, said method comprising the steps of:
   a) inputting a battery type into a computer;
   b) measuring a taper input charge for said battery, said taper input charge being input into said computer;
   c) executing a taper input charge correlation algorithm based on inputs comprising:
      i) the type of said battery inputted into said computer; and
      ii) the measured taper input charge for said battery; and
   d) determining the age of said lithium sulfur battery based on said taper input charge correlation algorithm.

21. The method of claim 20, wherein said inputs to said taper input charge correlation algorithm further comprise measured battery temperature.

22. A system for creating a look-up table of cell resistance versus state of charge for a lithium sulfur battery of a particular type and determining the capacity thereof, said system comprising:
   a) means for charging said battery until a voltage across said battery increases to a predetermined maximum voltage;
   b) means for continuing to charge said battery at said predetermined maximum voltage until an input current to said battery decreases to a predetermined minimum current;
   c) means for measuring a cell resistance for said battery, said cell resistance being defined as the cell resistance at 100% state of charge for said particular type of lithium sulfur battery;
   d) means for recording said cell resistance at 100% state of charge;

e) means for discharging said battery at a discharge rate to a predetermined lower cutoff voltage and means for recording a discharge time period;

f) means for integrating said discharge time period with said discharge rate and means for storing the result, said integration result being defined as the battery capacity for said particular type of lithium sulfur battery;

g) means for measuring a cell resistance for said battery, said cell resistance being defined as the cell resistance at 0% state of charge for said particular type of lithium sulfur battery;

h) means for recording said cell resistance at 0% state of charge;

i) means for charging said battery with a predetermined percentage of said battery capacity so that a present battery state of charge exceeds a previous battery state of charge;

j) means for measuring a cell resistance for said battery, said cell resistance being defined as the cell resistance at the present state of charge for said particular type of lithium sulfur battery;

k) means for recording said cell resistance at the present state of charge; and l) means for creating said look-up table of cell resistance versus state of charge for state of charge values from 0% to 100%.

23. A system for creating a look-up table of cell resistance versus state of charge for a lithium sulfur battery of a particular type with a known capacity, said system comprising:

a) means for charging said battery until a voltage across said battery increases to a predetermined maximum voltage;

b) means for continuing to charge said battery at said predetermined maximum voltage until an input current to said battery decreases to a predetermined minimum current;

c) means for measuring a cell resistance for said battery, said cell resistance being defined as the cell resistance at 100% state of charge for said particular type of lithium sulfur battery;

d) means for recording said cell resistance at 100% state of charge;

e) means for discharging said battery by a predetermined percentage of the capacity of said battery so that a present battery state of charge is less than a previous battery state of charge;

f) means for measuring a cell resistance for said battery, said cell resistance being defined as the cell resistance at the present state of charge for said particular type of lithium sulfur battery;

g) means for recording said cell resistance at the present state of charge; and h) means for creating said look-up table of cell resistance versus state of charge for state of charge values from 100% to 0%.

24. A system for determining the state of charge of a lithium sulfur battery of a particular type using a look-up table of cell resistance versus state of charge for said particular type of lithium sulfur battery, said system comprising:

a) means for inputting a battery type into a computer;

b) means for measuring a cell resistance for said battery, said cell resistance being input into said computer;

c) means for executing a cell resistance correlation algorithm based on inputs comprising:
   i) the type of said battery inputted into said computer; and
   ii) the measured cell resistance for said battery; and d) means for determining the state of charge of said lithium sulfur battery based on said cell resistance correlation algorithm.

25. A system for creating a look-up table of taper input charge versus age for a lithium sulfur battery of a particular type, said system comprising:

a) means for subjecting said battery to a first known number of fully charging and discharging cycles;

b) means for charging said battery until a voltage across said battery increases to a predetermined maximum voltage;

c) means for taper charging said battery at said predetermined maximum voltage until an input current to said battery decreases to a predetermined minimum current and means for recording a taper charge time period;

d) means for integrating said taper charge time period with said input current during said taper charge time period and storing the result, said integration result being defined as the taper input charge for said particular type of lithium sulfur battery at the age of said particular number;

e) means for recording said taper input charge at said age of said particular number; and f) means for creating said look-up table of taper input charge versus age for said particular type of lithium sulfur battery using said first known and additional known numbers of fully charging and discharging cycles for said battery.

26. A system for determining the age of a lithium sulfur battery of a particular type using a look-up table of taper input charge versus age for said particular type of lithium sulfur battery, said method comprising the steps of:

a) means for inputting a battery type into a computer;

b) means for measuring a taper input charge for said battery;

c) means for inputting said taper input charge into said computer;

d) means for executing a taper input charge correlation algorithm based on inputs comprising:
   i) the type of said battery inputted into said computer; and
   ii) the measured taper input charge for said battery; and e) means for determining the age of said lithium sulfur battery based on said taper input charge correlation algorithm.

* * * * *